United States Patent [19]
Young et al.

[11] Patent Number: 5,169,486
[45] Date of Patent: Dec. 8, 1992

[54] CRYSTAL GROWTH APPARATUS AND PROCESS

[75] Inventors: Morris S. S. Young, Danville; Shanxiang Zhang, Santa Clara, both of Calif.

[73] Assignee: Bestal Corporation, Dublin, Calif.

[21] Appl. No.: 665,468

[22] Filed: Mar. 6, 1991

[51] Int. Cl.$^5$ ............................................. C30B 11/00
[52] U.S. Cl. .............................. 156/616.4; 156/616.1; 156/616.2; 156/616.3; 156/616.41; 422/248
[58] Field of Search ............... 156/616.1, 616.2, 616.3, 156/616.4, 616.41; 422/248

[56] References Cited

U.S. PATENT DOCUMENTS

| | | | |
|---|---|---|---|
| 3,696,038 | 10/1972 | Davies et al. | 156/616.41 |
| 3,796,552 | 3/1974 | Robinson et al. | 422/248 |
| 4,083,748 | 4/1978 | Gault | 156/515.41 |
| 4,264,406 | 4/1981 | Haeskaylo | 156/616.41 |
| 4,708,763 | 11/1987 | van Hoof | 156/616.41 |
| 4,946,542 | 8/1990 | Clemans | 156/616.41 |

Primary Examiner—Olik Chaudhuri
Assistant Examiner—Felisa Garrett
Attorney, Agent, or Firm—Baker & McKenzie

[57] ABSTRACT

A circular crucible for use in VGF and VB methods of crystal growth includes: a seed well, a first transition region, a first stable growth region, a second transition region, and a major growth region.

7 Claims, 3 Drawing Sheets

CRYSTAL GROWTH APPARATUS AND PROCESS

TECHNICAL FIELD

This invention relates to the growth of relatively large diameter single crystal structures using the Vertical Gradient Freeze (VGF) and Vertical Bridgman (VB) methods of crystal growth.

BACKGROUND OF THE INVENTION

With the passage of time, there are increased numbers of commercial applications for single crystal structures formed of a large number of elements and compounds.

The VGF and VB methods of crystal growth enjoy commercial popularity because of the basic simplicity of the apparatus and their ability to economically and consistently grow relatively defect free single crystal structures of moderate size.

The VGF and VB methods are extensively used to grow crystals of both III-V and II-VI compounds. By way of example, it is common practice to grow Gallium Arsenide (GaAs) crystals having a two inch diameter and a length of several inches.

The emergence of large scale integrated (LSI) devices, very large scale integrated (VLSI) devices; and the commercial development of high volume crystal wafers all demand both larger diameter and longer crystals which can be economically grown in a reproducible manner.

While there has been some success in growing larger diameter crystal structures by VGF and VB methods, there is a ever present tendency to develop twinning and other polycrystaline structures. Each failed attempt is costly of time, manpower and money.

The apparatus for practicing the VGF and VB methods, in general terms, comprises: a crucible in which the crystal is grown; and apparatus for controlled heating of the contents of the crucible in a desired heat pattern.

The crucible is held in a fixed position in the heating apparatus and the heat pattern is controlled in Vertical Gradient Freeze (VGF) apparatus; and the crucible is moved vertically through the heating apparatus to achieve the desired heat pattern in Vertical Bridgman (VB) apparatus.

A crucible is composed of a material which does not react with the process materials; and the wall thickness is selected to promote the desired mechanical strength and heat flow.

A typical prior art circular crucible comprises: a seed well, a transition region and a major growth region. The seed well may have a diameter in the order of 0.25 inches and a length in the order of 1.5 inches. The transition region is a truncated cone which joins the seed well at the smaller diameter end; and joins the major growth region at the larger diameter end. Although cones of a wide range of included angles have been employed as transition regions, a transition region having an included angle of 90 degrees is a compromise value which is widely used. The dimensions of the major growth region are tailored to the desired size of the end product. The major growth region and the seed well may taper outwardly in the order of one degree to facilitate removal of the crystal from the crucible or they may have straight walls.

It is well known that the risk of defect nucleation is higher in the transition region than in the major growth region of the crucible. The typical defects which are encountered are: high dislocation clusters, lineages, poly-crystal nuclei, and twin formation. Once such defects are formed in the transition region, the defect usually migrates into the body of the crystal which renders at least part of the product useless.

DISCLOSURE OF THE INVENTION

In accordance with my invention, a crucible for use in Vertical Gradient Freeze (VGF) and Vertical Bridgman (VB) methods of crystal growth comprises: at least two transition growth regions and an intervening essentially stable growth region. In one embodiment of my invention, the crucible has a circular cross section throughout the entire length. In other embodiments of my invention, growth regions having a rectangular cross section may be employed.

In accordance with my invention, the process of growing a crystal in a circular crucible in VGF and VB processes comprises the following steps: growing a crystal from a small diameter seed crystal to an intermediate larger diameter in a first transition region of growth; growing the crystal from the intermediate diameter to the same diameter or to a modestly increased second intermediate diameter in an essentially stable region of growth; growing the crystal from the second intermediate diameter to a target end product larger diameter in a second transition region of growth; and growing the crystal to a target end product length in a stable major growth region.

DETAILED DESCRIPTION

Figure 1:
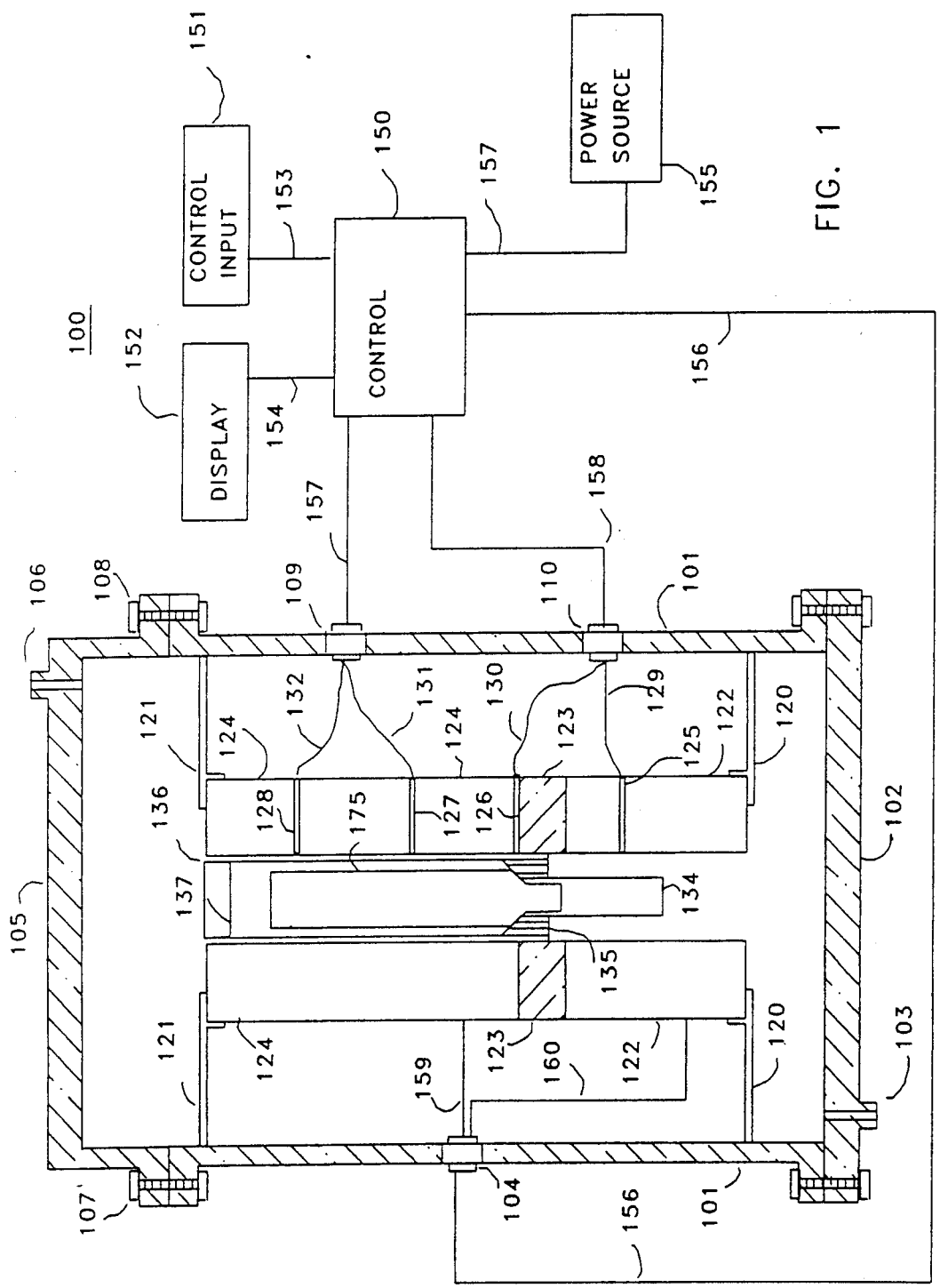
FIG. 1 shows a cross section of an illustrative VGF crystal growth apparatus and related power and controls.

For purposes of illustration only, my invention is described in the context of the illustrative Vertical Gradient Freeze (VGF) apparatus of FIG. 1. Although my invention is equally applicable to Vertical Bridgman (VB) apparatus, only VGF apparatus is described herein.

The VGF apparatus 100 of FIG. 1 comprises: a water cooled cylindrical stainless steel housing 101, 102, 105; heater support 120; low temperature heater 122; baffle 123; high temperature heater 124; ampule 136; ampule plug 137; ampule support 135; crucible 175, heater support 121; thermocouples 125-128; thermocouple Conductors 129-132; thermocouple ports 109, 110 in housing 101; thermocouple cables 157, 158, control module 150; control manual input 151; control display 152; power cables 156, 159, 160; gas input port 103; and gas relief port 106. The arrangements of FIG. 1 are illustrated in schematic form and they are not intended to show details of construction or absolute scale of the elements; and the coils for cooling the housing are not shown in the drawing.

The low temperature heater 122 and the high temperature heater 124 each comprise multiple tap resistance heaters. Low temperature heater 122 typically provides a stable temperature in the range of 500-700 degrees centigrade in the region below baffle 123; and high temperature heater 124 provides temperatures which are high enough to keep the source material above its melting point in the region above baffle 123.

A first power cable 159 comprises a plurality of wires for applying power to the taps of the high temperature heater 124; and a second power cable 160 comprises a plurality of conductors for applying power to the taps of low temperature heater 122.

Control module 150 controls the patterns of heat applied to the contents of crucible 175 in accordance with local operating parameters established by manual control input 151. Display 152 provides certain operating data to an operator.

Output signals of thermocouples 125-128 are transmitted to Control module 150 via conductors 129-132, ports 109, 110, and cables 157 and 158. The number of thermocouples shown in FIG. 1 is for the purpose of illustration only; and in actual practice the number employed is a matter of design choice.

Control module 150 controls the application of power from power source 155 to heaters 122 and 124 via cable 156, power port 104, and cables 159 and 160.

Except for gas input port 103 and gas relief port 106, the stainless steel housing 101, 102, 105 is sealed. In the VGF apparatus of FIG. 1, an inert gas e.g., nitrogen is introduced into the housing to counter-balance vapor pressures inside the growth ampule 136. The water cooled stainless steel housing 101, 102, 105 serves as a safety chamber in the event of a furnace malfunction or other accident; and serves to contain any poisonous gasses e.g., arsenic which may leak out of ampule 136.

Figure 2:
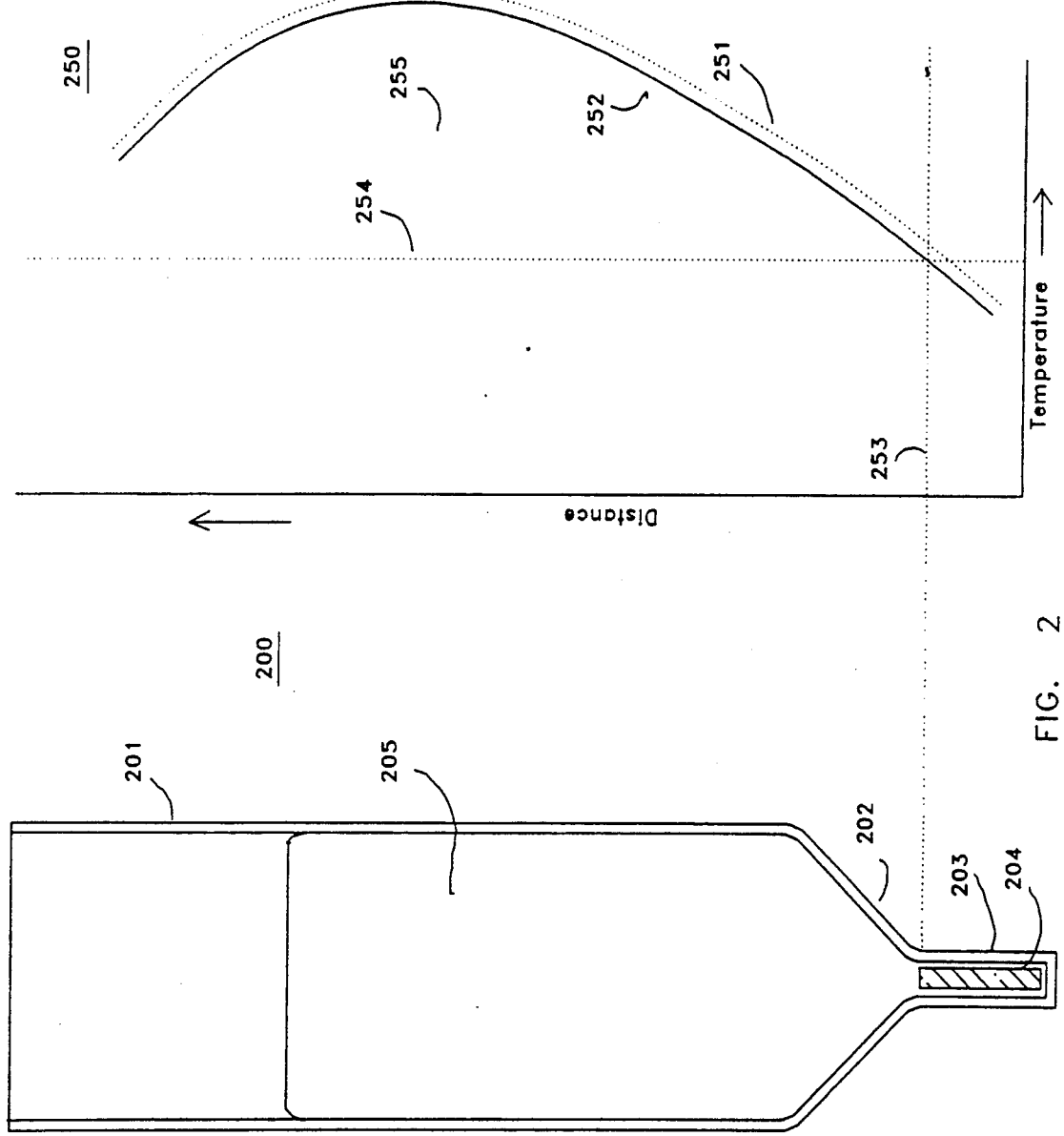
FIG. 2 shows a prior art crucible with an illustrative plot of temperature applied to the crucible.

Crucible 200 of FIG. 2 corresponds to crucible 175 of FIG. 1. The illustrative crucible 200 comprises a seed well 203, a transition region 202, and a major growth region 201. A properly oriented seed crystal 204 of the desired material is placed in well 203; and corresponding raw material 205 is placed in the transition region 202 and the major growth region 201.

After the crucible is prepared with a properly oriented seed crystal and the corresponding charge material, it is placed in the furnace of FIG. 1 in the position of crucible 175; the cover 105 is installed; gas is introduced through port 103; and control 150 is energized to control heaters 122 and 124 to bring the contents of the crucible to the desired starting temperature profile.

A generalized plot of temperature versus distance is shown in the right side of FIG. 2. In FIG. 2, line 253 represents the top surface of seed crystal 204; and line 254 represents the melting point of the seed crystal material. Lines 251 and 252 illustrate a profile of temperature as a function of vertical distance. In the case of line 252, the temperature at the surface of seed crystal 204 is at its melting point, the temperature of the remainder of the seed is below the melting point; and all of the charge material 205 is above the melting point and the charge is fully melted. The growth process is initiated by slightly increasing the temperature profile to values corresponding to line 251 to melt off a small portion of the seed material. Thereafter, the temperature is lowered gradually by control module 150 to induce solidification of the melted charge material onto the seed; and to cause the melted charge material to freeze continuously in the upward direction to grow a single crystal structure. After the charge material is fully solidified, the temperature is lowered to the ambient state and the crystal can be removed from the crucible.

Unfortunately, it is not possible to directly observe crystal growth in VGF and VB crystal growth apparatus; and success or failure is not known until the process is complete and the product is removed from the crucible. Since each failure to grow a "good" crystal, is very costly of time and money, persons, who are engaged in serious commercial crystal growth, develop personal, highly controlled protocols which are discrete to their growth apparatus and materials.

Advantageously, the growth of single crystal structures in accordance with my invention generally does not require any substantial alteration of established local protocols.

Figure 3:
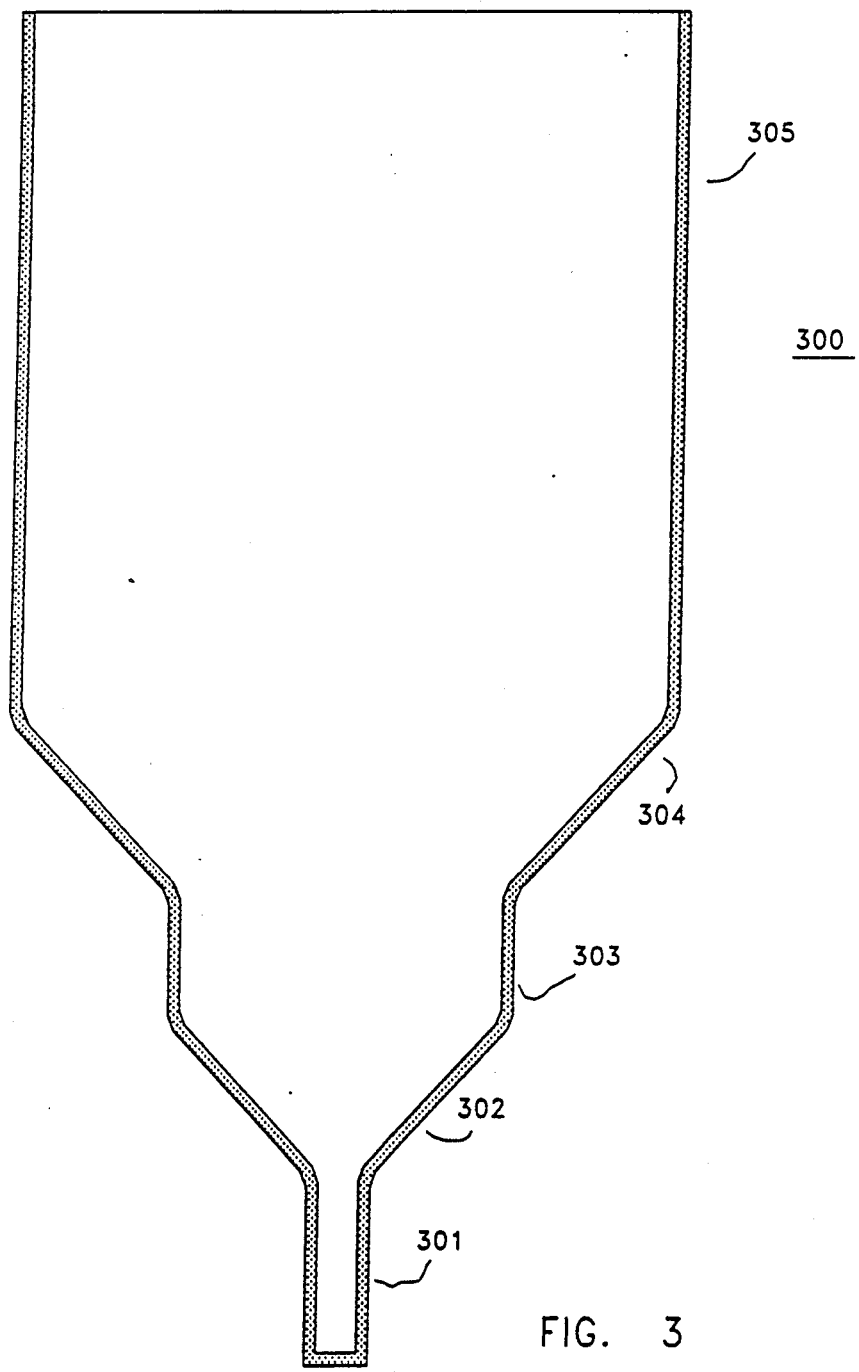
FIG. 3 shows an illustrative multiple transition crucible in accordance with my invention.

One illustrative embodiment of a crucible in accordance with my invention is shown in FIG. 3. In FIG. 1, crucible 300 may be substituted for crucible 175. Of course, ampule 136 must be large enough to receive crucible 300. Crucible 300 is made of a material which not react with the melt material; and the walls are designed to have the desired strength and heat transfer characteristics.

Crucible 300 comprises a seed well 301, a first transition region 302, a stable growth region 303, a second transition region 304, and a major growth region 305. Seed well 301 and transition region 302 correspond in function, respectively, to seed well 203 and transition region 202 of FIG. 2. In FIG. 3, stable growth region 303 and second transition region 304 are interposed between first transition region 302 and major growth region 305. BY way of example only, seed well 301 may have a diameter of 0.25 inches and a length of 1.5 inches. The conical first transition region 302 has an included angle of 90 degrees and a diameter of approximately 2 inches at its top. Cylindrical stable growth region 303 may have a constant diameter or it may be tapered outwardly in the direction of crystal growth. By way of example, the stable region may be one inch long and contain a one degree outward taper to facilitate removal of the crystal from the crucible.

Advantageously, if the diameter of the first stable growth region 303 is selected to match the diameter of a standard product, the portion of the crystal grown in that region may be processed at that smaller standard diameter to provide usable product. Therefore, the time and the material used in growing the crystal in region 303 are not wasted.

The conical second transition region 304 has an included angle of 90 degrees and its diameter at the top end is equal to the target diameter of the final product. By way of example, the target diameter may be approximately four inches.

The cylindrical major growth region 305, may have a constant diameter; or it may be tapered outwardly in the direction of growth to facilitate removal of the end product from the crucible. The length of the region 305 is established by the length of the final product e.g., five inches.

Although, not illustrated herein, additional intermediate transition regions and stable growth regions may be added to achieve growth of larger diameter products.

The invention has been described with particular attention to its preferred embodiment; however, it should be understood that variations and modifications within the spirit and scope of the invention may occur to those skilled in the art to which the invention pertains.

What is claimed is:

1. A method of growing single crystal structures in circular crucibles in VGF and VB processes comprising the following steps:
    growing a crystal form a small diameter seed crystal to an intermediate larger diameter in a first transition region of growth;
    growing the crystal in length at said intermediate diameter in an essentially stable growth region.
    growing the crystal from said intermediate diameter to a substantially larger target end product diameter in a second transition region of growth;
    growing the crystal to a target end product length in a stable major growth region.

2. A circular crucible for growing single crystal structures having a target diameter for use in VGF and VB methods of crystal growth comprising:
    at least first and second circular transition growth regions; said transition growth regions each comprising a truncated cone comprising a small open end and a large open end; the diameter of the large open end of said second transition region corresponding to said target diameter;
    a tubular seed well closed on one end and open on the other end, said open end of said seed well being mechanically aligned with and attached to the small open end of said first transition region; the diameters of said large open end of said first transition region and of the small open end of said second transition being equal to one and another and having a value substantially smaller than said target diameter;
    at least one stable tubular intermediate sized growth region open on both ends; one end of said intermediate sized growth region being mechanically aligned with and attached to said large open end of said first transition region; and the other end of said intermediate sized growth region being mechanically aligned with and connected to said small end of said second transition region; and a terminal tubular major growth region being mechanically aligned with and connected to said large open end of said second transition growth region.

3. A circular crucible for growing single crystal structures in accordance with claim 1 wherein: said target diameter is four inches.

4. A circular crucible for growing single crystal structures in accordance with claim 1 wherein: the diameter of said intermediate sized growth region is two inches.

5. A circular crucible for growing single crystal structures in accordance with claim 1 wherein: the included angle of each of said truncated cones is ninety degrees.

6. A circular crucible for growing single crystal products having a target diameter for use in VGF and VB methods of crystal growth comprising: first and second truncated cone shaped transition growth regions; a seed well adjacent one end of said first transition growth region; an essentially stable intermediate sized growth region having a diameter substantially smaller than said target diameter interposed between said first and second transition regions; and a terminal product growth region adjacent said second transition growth region and having a diameter corresponding to said target diameter.

7. A circular crucible for growing single crystal products in accordance with claim 8 wherein: said target diameter is four inches.

* * * * *